United States Patent
Scheel et al.

(10) Patent No.: US 9,541,618 B2
(45) Date of Patent: Jan. 10, 2017

(54) STATE SPACE FEEDBACK CONTROLLER IN THE DIGITAL DOMAIN FOR AN MRI GRADIENT COIL POWER SUPPLY

(75) Inventors: Thomas Scheel, Stolberg (DE); Christian Hattrup, Wurselen (DE)

(73) Assignee: KONINKLIJKE PHILIPS ELECTRONICS N.V., Eindhoven (NL)

( * ) Notice: Subject to any disclaimer, the term of this patent is extended or adjusted under 35 U.S.C. 154(b) by 814 days.

(21) Appl. No.: 13/995,505

(22) PCT Filed: Dec. 15, 2011

(86) PCT No.: PCT/IB2011/055700
§ 371 (c)(1),
(2), (4) Date: Jun. 19, 2013

(87) PCT Pub. No.: WO2012/085777
PCT Pub. Date: Jun. 28, 2012

(65) Prior Publication Data
US 2013/0285664 A1 Oct. 31, 2013

(30) Foreign Application Priority Data
Dec. 20, 2010 (EP) .................................. 10195839

(51) Int. Cl.
*G01V 3/00* (2006.01)
*G01R 33/385* (2006.01)
(52) U.S. Cl.
CPC ................................ *G01R 33/3852* (2013.01)
(58) Field of Classification Search
CPC ................................................ G01R 33/3852
(Continued)

(56) References Cited

U.S. PATENT DOCUMENTS 5,442,290 A 8/1995 Crooks
6,150,821 A 11/2000 Mori et al.
(Continued)

FOREIGN PATENT DOCUMENTS

WO 2010004492 A1 1/2010

OTHER PUBLICATIONS

Fukuda, H., et al.; State-Vector Feedback Control-based 100kHz Carrier PWM Power Conditioning Amplifier and Its High-Precision Current-Tracking Scheme; 1993; Industrial Electronics, Control and Instrumentation; pp. 1105-1110.

(Continued)

*Primary Examiner* — Louis Arana (57) ABSTRACT

A state space feedback controller operates in the digital domain for the regulation of the current supply to MRI gradient coils from a multiple-bridge PWM power amplifier. The PI-controller includes an integration part (for the integration of the difference between the demand current and the measured gradient coil current) and a subsequent P-controlled system which in turn includes a delay compensator/stabilizer and a plant. The delay compensator/stabilizer includes a multi-path feedback loop by means of which its digital output signal is fed back through delay blocks, on the one hand, and through filter units, on the other hand. The filter units model the transfer functions of a gradient coil output filter for the gradient coil voltage and the output current of the amplifier inverter units, respectively. In the plant, a filter unit, which models the gradient coil transfer function, is connected in series to a delay chain for the delay of the measurement value of the gradient coil current.

5 Claims, 6 Drawing Sheets (58) Field of Classification Search
USPC .................................... 324/314, 318, 322
See application file for complete search history.

(56) References Cited

U.S. PATENT DOCUMENTS

| | | | |
|---|---|---|---|
| 6,323,649 | B1 | 11/2001 | Pace |
| 6,369,572 | B1 | 4/2002 | Van Groningen et al. |
| 6,400,158 | B1 * | 6/2002 | Van Groningen . G01R 33/3852 324/318 |
| 7,116,166 | B2 | 10/2006 | Sabate et al. |
| 7,253,625 | B2 | 8/2007 | Trabbic et al. |
| 8,937,820 | B2 * | 1/2015 | Huisman ............ G01R 33/3852 323/283 |
| 2014/0354281 | A1 * | 12/2014 | Scheel ............... G01R 33/3852 324/318 |
| 2015/0316629 | A1 * | 11/2015 | Kawajiri ............ G01R 33/3852 324/322 |

OTHER PUBLICATIONS

Ki, T., et al.; Parameter Determining Method of Robust Digital Controller for PWM Power Amplifier; 2009; ICROS-SICE; pp. 4553-4558.

Takano, H., et al.; Multiple-Bridge PWM Current-Regulated Power Amplifier for Magnetic Resonance Imaging System and Its Feasible Digital Control Implementation; 1999; Industrial Electronics Society; vol. 2:785-790.

Watanabe, S., et al.; Advanced Digital Control Scheme of Two-Paralleled Bridge Type Current Tracking Power Conversion Amplifier for Magnetic Resonance Imaging; 1997; Power Electronics and Drive Systems; vol. 1:513-518.

Watanabe, S., et al.; Development of Digital Optimum Predictive Control Implementation for Gradient Magnetic Field Current Controller in MRI System; Power Conversion Conference; vol. 3:999-1004.

* cited by examiner

FIG. 9 ns, a rise and fall time of the pulses of for example each
STATE SPACE FEEDBACK CONTROLLER IN THE DIGITAL DOMAIN FOR AN MRI GRADIENT COIL POWER SUPPLY

FIELD OF THE INVENTION

The invention relates to a method and a digital amplifier system for operating an MRI (magnetic resonance imaging) gradient magnet system for generating gradient magnetic fields especially for spatially encoding MR (magnetic resonance) relaxation signals.

BACKGROUND OF THE INVENTION

In an MRI system or MR scanner, an examination object, usually a patient, is exposed to a uniform main magnetic field ($B_0$ field) so that the magnetic moments of the nuclei within the examination object tend to rotate around the axis of the applied $B_0$ field (Larmor precession) with a certain net magnetization of all nuclei parallel to the $B_0$ field. The rate of precession is called Larmor frequency which is dependent on the specific physical characteristics of the involved nuclei, namely their gyromagnetic ratio, and the strength of the applied $B_0$ field. The gyromagnetic ratio is the ratio between the magnetic moment and the spin of a nucleus.

By transmitting an RF excitation pulse ($B_1$ field) which is orthogonal to the $B_0$ field, generated by means of an RF transmit antenna, and matching the Larmor frequency of the nuclei of interest, the spins of the nuclei are excited and brought into phase, and a deflection of their net magnetization from the direction of the $B_0$ field is obtained, so that a transversal component in relation to the longitudinal component of the net magnetization is generated.

After termination of the RF excitation pulse, the relaxation processes of the longitudinal and transversal components of the net magnetization begin, until the net magnetization has returned to its equilibrium state. MR relaxation signals which are emitted by the transversal relaxation process, are detected by means of an MR/RF receive antenna.

The received MR relaxation signals which are time-based amplitude signals, are Fourier transformed to frequency-based MR spectrum signals and processed for generating an MR image of the nuclei of interest within an examination object. In order to obtain a spatial selection of a slice or volume within the examination object and a spatial encoding of the received MR relaxation signals emanating from a slice or volume of interest, gradient magnetic fields are superimposed on the $B_0$ field, having the same direction as the $B_0$ field, but having gradients in the orthogonal x-, y- and z-directions. Due to the fact that the Larmor frequency is dependent on the strength of the magnetic field which is imposed on the nuclei, the Larmor frequency of the nuclei accordingly decreases along and with the decreasing gradient (and vice versa) of the total, superimposed $B_0$ field, so that by appropriately tuning the frequency of the transmitted RF excitation pulse (and by accordingly tuning the resonance frequency of the MR/RF receive antenna), and by accordingly controlling the gradient magnetic fields, a selection of nuclei within a slice at a certain location along each gradient in the x-, y- and z-direction, and by this, in total, within a certain voxel of the object can be obtained.

For generating the gradient magnetic fields, a gradient magnet system comprising a number of gradient magnets in the form of coils (gradient coils) is provided which is typically operated by means of a gradient amplifier system for generating electrical currents for supplying the gradient coils. Usually, such gradient coil currents have a certain waveform which has to be produced by the gradient amplifier system very precisely. The waveform is for example a trapezoid pulse with a pulse time of for example about 40 ms, a rise and fall time of the pulses of for example each about 0.2 ms, and having an amplitude in the order of several hundreds and up to about 1000 A. These current pulses have to be accurately controlled with a deviation of only several mA or less in order to ensure a generation of the MRI images at a high quality and high spatial resolution and precision.

WO 2010/004492 discloses a digital amplifier with feedforward and feedback control for generating and controlling the electrical output power for operating such a gradient magnet system. Basically, such a digital amplifier comprises an input for receiving a digital input signal representing the desired shape of a current curve of an analog output signal of the amplifier by which analog output signal the gradient magnet system is driven. The amplifier comprises a feedforward and a feedback controller in order to determine and compensate an error signal between the input signal and the output signal. The feedforward controller reads the input signal and predicts the output signal as accurate as possible based on a model of the system. Then the predicted output signal is subtracted in the analog domain from the measured analog output signal, and the resulting analog power differential current is converted into the digital domain for providing a feedback signal which is then combined with the feedforward signal. This results in a digital representation of the determined output signal which is now subtracted from the desired digital input signal so that an error signal results which is fed to a digital controller for providing an appropriate control signal to a modulator to counter the error signal. The modulator converts the control signal into a PWM signal which is provided to a power converter which generates the analog output signal for driving the gradient magnet system.

SUMMARY OF THE INVENTION

Due to the above mentioned accuracy requirements of the current pulses for operating the gradient magnet system, known gradient amplifier systems are controlled more or less analogously because a digital control inherently suffers from digital discretization noise and certain digitization effects. It has revealed that especially the limited resolution of the A/D converters and of the PWM modulators, as well as the limited processing speed of the digital controllers can cause severe deviations and reproducibility problems when generating a desired gradient magnet current.

Generally, one object underlying the invention is to provide a method and a digital amplifier system for operating an MRI gradient magnet system on the basis of a fully digital control without causing the above or other problems, but instead fulfilling the accuracy requirements as mentioned above much more exactly than with known solutions.

Another object underlying the invention is to provide a method and a digital amplifier system for operating an MRI gradient magnet system with high accuracy and at comparatively low costs and on the basis of comparatively cheap and standard slow off-the-shelf power components.

The control concept as provided by the invention has a very high disturbance suppression so that the above digitization effects are maximally suppressed and consequently standard digital components such as off-the-shelf A/D converters can be used for the realization of the digital controller.

Further, the invention enables to realize a method and a digital amplifier system for operating an MRI gradient magnet system on the basis of high precision control concepts and their associated design algorithms such that the above requirements can be fulfilled also for a fully digital control.

Another advantage of the solution according to the invention is that for the proposed state space control method no feedforward control is required in order to increase the bandwidth. Consequently, the state space controller concept according to the invention is more robust to varying system parameters and has a higher disturbance suppression than a standard controller concept like a PID controller.

All this enables the use of a fully digital controller and by this a fully digital amplifier system for operating an MRI gradient magnet system with cost effective standard digital components. Furthermore, the above leads to a better reproducibility of the output current resulting in a better image quality of the MRI system.

The dependent claims disclose advantageous embodiments of the invention.

It will be appreciated that features of the invention are susceptible to being combined in any combination without departing from the scope of the invention as defined by the accompanying claims.

Further details, features and advantages of the invention will become apparent from the following description of preferred and exemplary embodiments of the invention which are given with reference to the drawings.

DETAILED DESCRIPTION OF EMBODIMENTS

Figure 1:
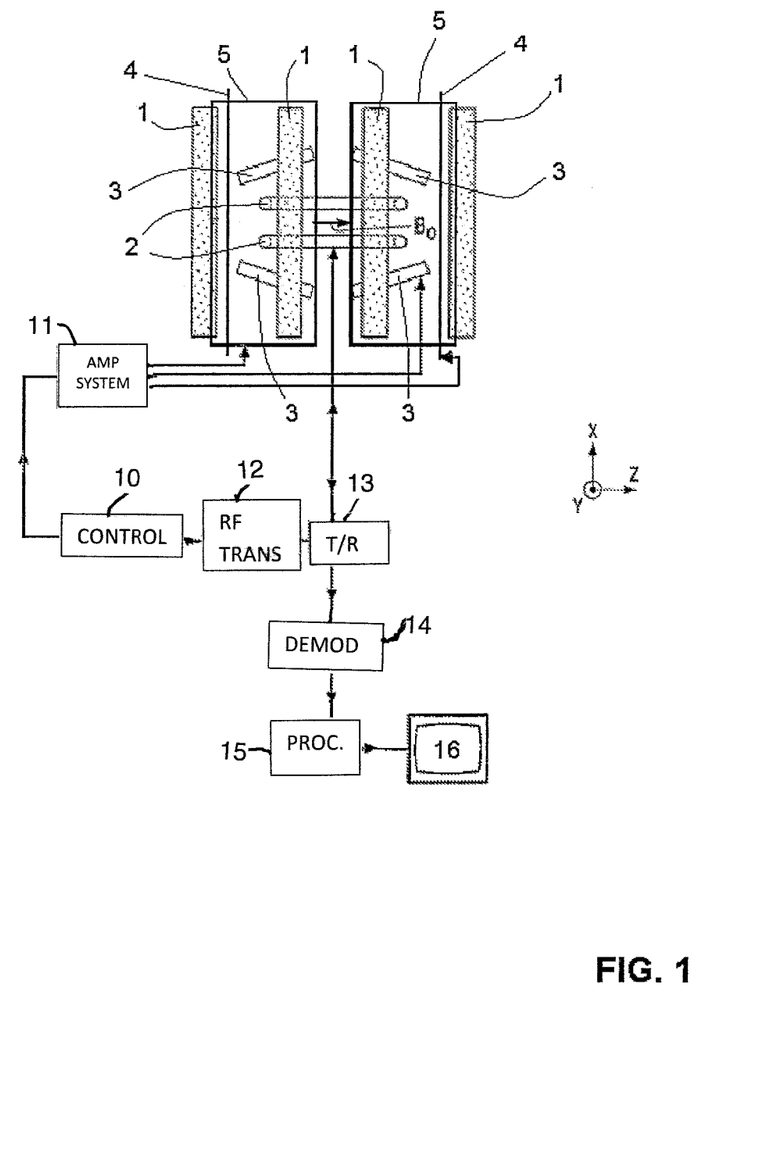
FIG. 1 shows substantial components of an MR imaging system or scanner.

FIG. 1 shows substantial components of a magnetic resonance imaging system or a magnetic resonance scanner including an examination volume in which an object to be imaged is placed. The system comprises a main magnet system 1 for generating an essentially uniform and steady main magnetic field $B_0$ in the z-direction for aligning the nuclear spins in the object to be imaged. An RF/MR transmit/receive antenna arrangement 2 is provided for transmitting RF signals for generating an RF magnetic alternating field $B_1$ for exciting nuclear magnetic resonances and for receiving subsequent MR relaxation signals from the related nuclei of the object to be imaged. For the spatial selection and spatial encoding of the received MR relaxation signals emanating from the excited nuclei, the system also comprises a gradient magnet system with a plurality of gradient magnetic field coils 3, 4, 5 by which gradient magnetic fields in the orthogonal x-, y- and z-directions, respectively, are generated as explained above.

Further, the magnetic resonance imaging system or magnetic resonance scanner comprises a control unit 10 which during RF transmission controls an RF transmitter unit 12 for generating the RF signals which are fed via an RF transmit/receive circuit 13 to the RF antenna arrangement 2. The received MR relaxation signals are fed via the RF transmit/receive circuit 13 to an amplifier and demodulator unit 14 and are processed by means of a processing unit 15 for generating an MR image of the examination object on a display unit 16. Further, during the MR signal reception, the control unit 10 generates control signals to an amplifier system 11 for generating electrical output power especially in the form of output currents for operating each of the gradient magnetic field coils 3, 4, 5 in order to select a desired slice or volume within the examination object to be imaged on the display unit 16 as generally known.

The above and the following principles and considerations are applicable both in the case of an axial (horizontal) MRI system in which a patient or another examination object is guided in an axial direction through a cylindrical or tubular examination space, and in case of a vertical (open) system having an examination space between an upper and a lower end of a C-arm structure.

Figure 2:
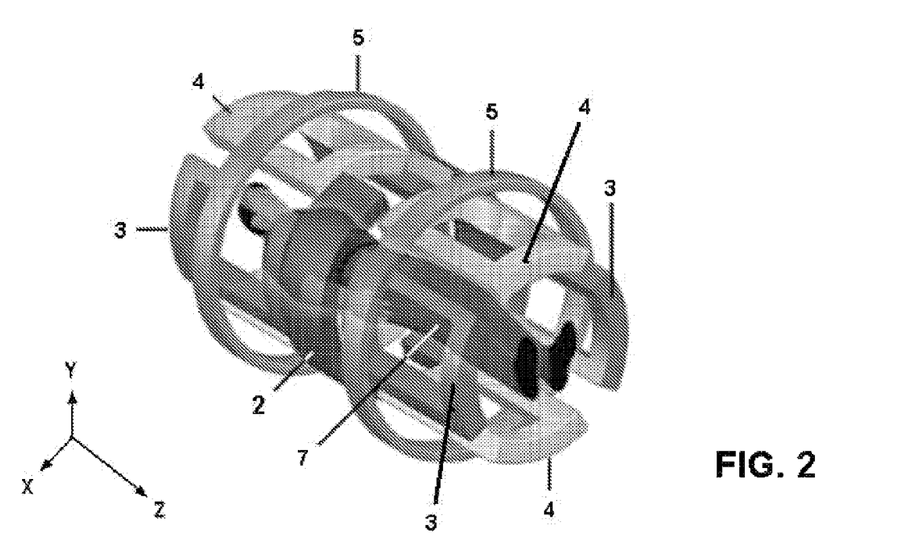
FIG. 2 shows a schematic view of an MRI gradient magnet system.

FIG. 2 shows in more details a schematic view of the arrangement of the gradients magnetic field coils 3, 4, 5 of an MRI gradient magnet system for a magnetic resonance imaging system or a magnetic resonance scanner.

For generating a position dependent or gradient magnetic field in the x-direction, first gradient magnetic field coils 3 are provided each along both sides of an examination object 7. For generating a position dependent or gradient magnetic field in the y-direction, second gradient magnetic field coils 4 are provided each above and underneath the examination object 7. Finally, third gradient magnetic field coils 5 are provided surrounding the examination object and being displaced in the z-direction for generating a position dependent or gradient magnetic field in the z-direction. An RF/MR transmit/receive antenna arrangement 2 is also schematically indicated in FIG. 2.

Figure 3:
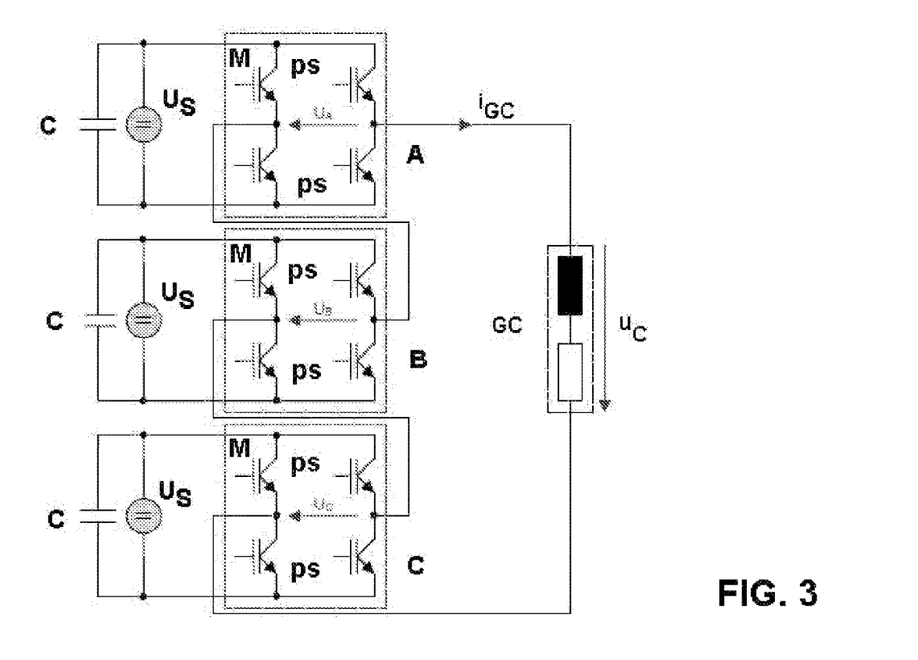
FIG. 3 shows a general topology of an amplifier system for operating a gradient coil of an MRI gradient magnet system.

FIG. 3 shows an exemplary general topology of a main power stage of a gradient amplifier system for operating each one of the first to third gradient coil (GC) 3, 4, 5 of the MRI gradient magnet system by driving a gradient coil current $i_{GC}$ through the same (a gradient coil output filter is not indicated in this figure). The power stage comprises preferably three (or more) full bridges which are connected in series, namely a first, a second and a third inverter A, B, C, for generating a first output voltage $U_A$, a second output voltage $U_B$ and a third output voltage $U_C$, respectively. Each full bridge comprises four power switches ps that can each be provided by several parallel connected IGBTs which are preferred due to cost reasons. It is further preferred to use known IGBT half or full bridge modules M including two of four IGBTs and even the gate driver electronics in order to further reduce the costs.

The power supply voltage $U_S$ (e.g. 600 V) of each full bridge each has a floating potential. Alternatively, only one power supply voltage could be used that loads the capacitors C of all full bridges by using an intelligent control approach.

Each full bridge or inverter A, B, C can generate three output voltage levels ($+U_S$, 0, $-U_S$) depending on the switch positions of the power switches ps. Thus, the series connection of the three full bridges can deliver seven different voltage levels. By such a topology, two substantial advantages are obtained. On the one hand, a high output voltage can be generated by low voltage power switches ps so that the costs caused by the power switches ps can be reduced. On the other hand, due to the high number of discrete voltage levels compared to a single full bridge amplifier the current ripple will be smaller mitigating the requirements on the gradient coil output filter and increasing current reproducibility.

Figure 4:
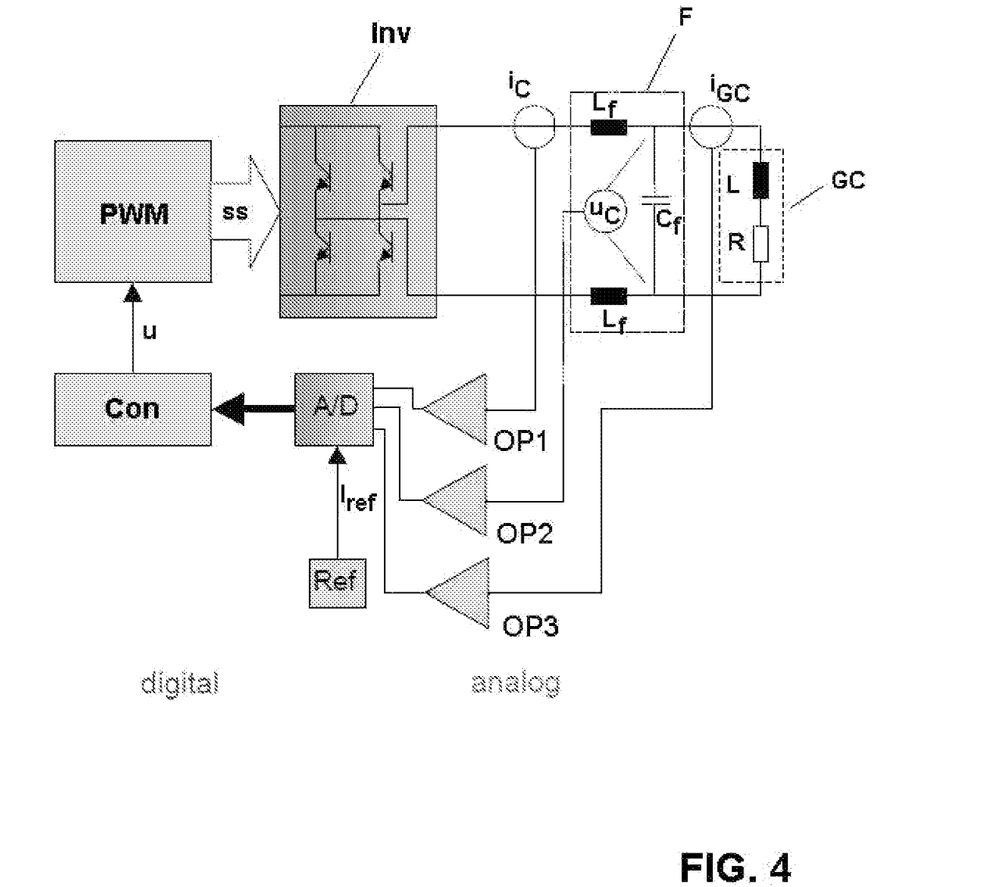
FIG. 4 shows a schematic architecture of one embodiment of a digitally controlled gradient amplifier system according to the invention.

In order to fulfill the above explained requirements of an amplifier system for operating a gradient magnet system, it has revealed that a closed loop control of the main power stages and of the output current of the amplifier system for the gradient coils is necessary and that a full digital control is especially advantageously. FIG. 4 shows a schematic architecture of an embodiment of such a digitally controlled gradient amplifier system according to the invention for each one of the first to third gradient coils (GC) 3, 4, 5.

It comprises a power stage, for example the three (or more) inverters A, B, C as shown in FIG. 3, which are indicated in FIG. 4 in a simplified representation in the form an inverter unit Inv. At the output of the inverter unit Inv, a gradient coil output filter F is schematically indicated having two series inductances $L_f$ and one parallel capacitor $C_f$. The (one of the first to third) gradient coil GC itself is indicated in the form of its equivalent circuit, namely a series connection of an inductance L and an ohmic resistor R. Further, the gradient amplifier system comprises a first current sensor for sensing the output current k of the inverter unit Inv, a second current sensor for sensing the gradient coil current $i_{GC}$ which is flowing through the gradient coil GC, and a voltage sensor for sensing the gradient coil voltage $u_C$ across the gradient coil GC.

The output current $i_C$ of the inverter unit Inv (inverter current), the gradient coil voltage $u_C$ and the gradient coil current $i_{GC}$ are provided to the inputs of a first, a second and a third low noise operational amplifier OP1, OP2, OP3, respectively, for amplifying the same in the analogue domain. The output terminals of the operational amplifiers OP1, OP2, OP3 are connected with inputs of a high resolution analog-to-digital converter A/D which also receives a reference current $I_{ref}$ from a reference current source Ref.

The digitized output values of the analog-to-digital converter A/D are provided to an input of a digital controller Con which is working on a digital hardware basis, such as a digital signal processor (DSP) or a field programmable gate array (FPGA) completely in the digital domain.

The output control signals u of the controller Con are provided to an input of a PWM modulator PWM for translating the output control signals u of the controller Con into appropriate switch signals ss. Finally, these switch signals ss are provided to the inverter unit Inv, in the example of FIG. 3 to the power switches ps of the inverters A, B, C, for switching the power supply voltages $U_S$ by means of the inverters A, B, C, so that a PWM voltage is generated at the output of the inverter unit Inv such, that a desired gradient coil current $i_{GC}$ having a certain waveform and amplitude as explained above is driven through the related gradient coil GC.

The advantages of such a digital control system, and especially of the full digital controller Con, are a higher flexibility, shorter development times and especially the fact that sophisticated control techniques for new system architectures are enabled. This last advantage is especially important as it will be used to reduce the cost of the whole gradient amplifier system which is highly important for new such systems. The cost reduction can be realized due to the fact that cheaper power electronic components can be used whose imperfections can be compensated with more sophisticated digital control algorithms.

The main problems which are encountered when realizing such a full digital control system are the transition from the analogue to the digital domain and the transition from the digital to the analogue domain. The main reasons for these problems are the limited value-resolution of the analogue-to-digital converter A/D, the limited processing speed (time-resolution) of the digital controller Con, and the limited time-resolution of the PWM-modulator PWM, which all can have the result that a desired gradient coil current $i_{GC}$ cannot be reproduced with the required accuracy as explained above.

Figure 5:
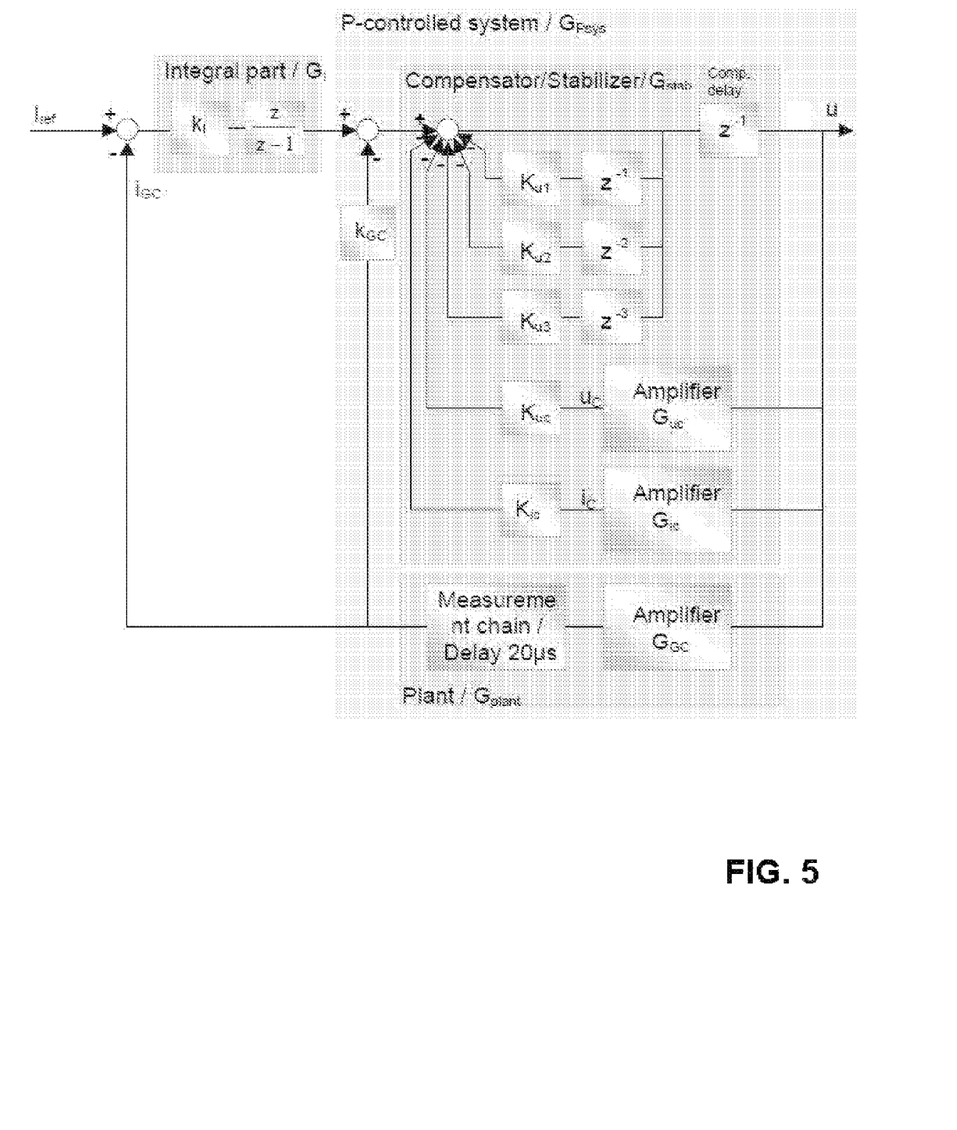
FIG. 5 shows the schematic functional structure of one embodiment of a digital controller for a gradient amplifier system according to the invention.

Generally, two different controller concepts can be used for realizing such a control system in the digital domain, namely a PID controller and a state space controller. It has revealed, that a state space controller concept has many advantages over the PID controller concept with respect to the suppression of the above limited resolutions and the robustness especially with respect to a change of the control response if system parameters deviate from their nominal values. The control structure and the functional blocks of a related state space PI controller are schematically indicated in FIG. 5.

The general components are an integration part $G_I$ and a P-controlled system $G_{PSYS}$. The P-controlled system $G_{PSYS}$ comprises a delay compensator/stabilizer $G_{STAB}$ and a plant $G_{PLANT}$.

The delay compensator/stabilizer $G_{STAB}$ comprises delay blocks $z^{-1}$, $z^{-2}$, $z^{-3}$ which indicate a computational delay by one, two and three clock cycles, respectively. Further, the delay compensator/stabilizer $G_{STAB}$ comprises control factors $K_{U1}$, $K_{U2}$, $K_{U3}$, for the computational delay by one, two and three clock cycles, respectively, of the output control signal u of the controller Con, and control factors $K_{UC}$ and $K_{IC}$ for the gradient coil voltage $u_C$ and the output current $i_C$ (see FIG. 4) of the inverter unit Inv, respectively. Finally, the delay compensator/stabilizer $G_{STAB}$ comprises the transfer functions $G_{UC}$ and $G_{IC}$ of the gradient coil output filter F (see FIG. 4) for the gradient coil voltage $u_C$ and the output current $u_C$ of the inverter unit Inv, respectively, and a control factor $K_{GC}$ for the gradient coil current $i_{GC}$.

The plant $G_{PLANT}$ comprises the transfer function $G_{GC}$ in series to the regular delay chain with 20 μs of the measurement value of the gradient coil current $i_{GC}$ of the A/D converter A/D plus additional filtering.

The measurement values $u_C$ and k are characterized by a delay which is equal to the computational delay. Thus, there is no additional delay chain for these measurement values.

In the integration part $G_I$, the control deviation which is the difference between the reference current $I_{ref}$ and the gradient coil current $i_{GC}$, is integrated. Further, the gradient coil current $i_{GC}$, fed via the control factor $K_{GC}$, is subtracted from the output of the integration part $G_I$. The gradient coil current $i_{GC}$ results at the output of the plant $G_{PLANT}$, at which input the output value u of the controller Con, delayed by one clock cycle $z^{-1}$, is applied.

The digital output value u of the controller Con, delayed by one clock cycle $z^{-1}$, is also fed back via the transfer function $G_{UC}$ and the control factor $K_{UC}$ and via the transfer function $G_{IC}$ and the control factor $K_{IC}$. Finally, the output value u of the controller Con is delayed by one, two and three clock cycles $z^{-1}$, $z^{-2}$, $z^{-3}$ and each delayed output value u is also fed back via the related control factors $K_{U1}$, $K_{U2}$, $K_{U3}$, respectively.

The parameters of such a feedback state space controller indicated in FIG. 5, especially the above mentioned control factors and transfer functions can be designed by known methods, for example a pole placement method or other.

Preferably, the poles are chosen to be real in order to ensure that there is no overshooting in the closed loop control response. Poles with absolute values smaller than one will guarantee the stability of the controller. The closer the poles are to zero the faster the control response will be. For example, poles of 0.15 will usually lead to a sufficiently high controller bandwidth while also guaranteeing maximum robustness against a variation of the controller parameters from their nominal values.

Figure 6:
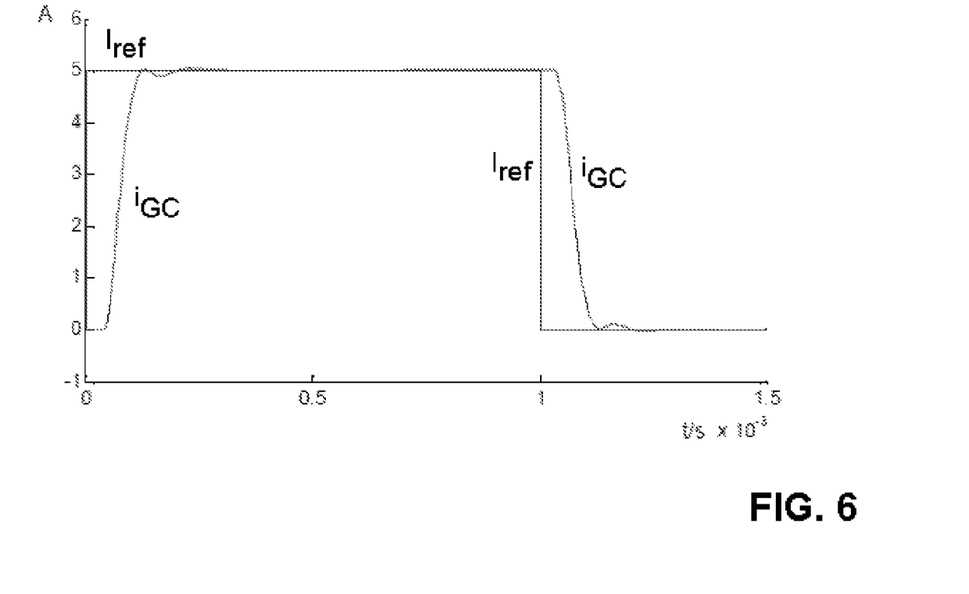
FIG. 6 shows an output signal of the controller according to FIG. 5 in response to a first input signal.

FIG. 6 shows the time domain simulation of the resulting state space controller for a step-input reference current $I_{ref}$ with 5 A amplitude. The control response is very fast. It takes about 40 μs (starting from the first control reaction) to reach 63% of the final value of the gradient coil amplifier current $i_{GC}$. There is slight over/undershooting present which results from the approximations made for the controller design. These are the averaging of the measurement value modeled by a pure delay and the non-integer delay modeled by a weighted sum of two integer-delayed values.

Figure 7:
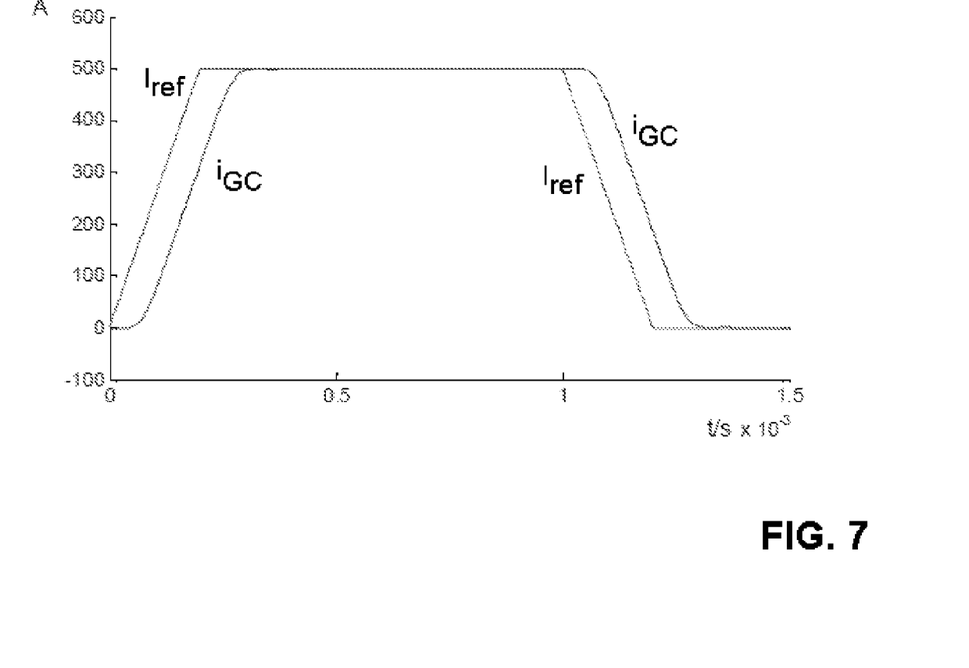
FIG. 7 shows an output signal of the controller according to FIG. 5 in response to a second input signal.

However, this is not critical, as the over/undershooting is even lower if a practically relevant ramp current $I_{ref}$ is applied as input to the controller as shown in FIG. 7 for a ramp current of 500 A. The non-idealities of the control response (gradient coil amplifier current $i_{GC}$) are hardly to be noticed.

Figure 8:
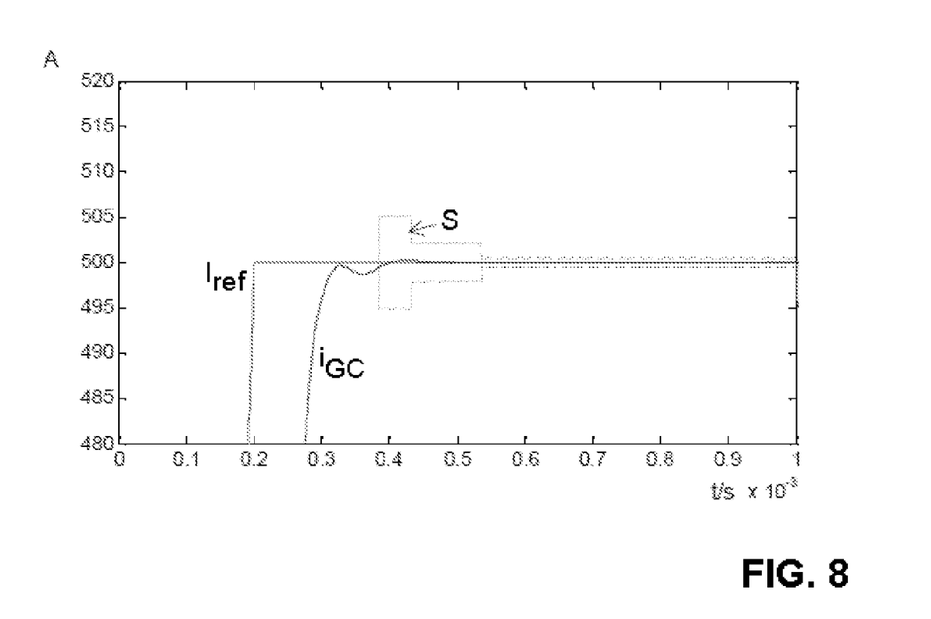
FIG. 8 shows an enlarged cut-out of the current shapes according to FIG. 6.

FIG. 8 shows a zoom into the critical region of the control response shown in FIG. 6. It points out that the maximum control deviation during over/undershoot is only about 1.4 A (0.3%). The corresponding settling behavior of $i_{GC}$ fully fulfils the settling requirement S for a gradient amplifier.

Figure 9:
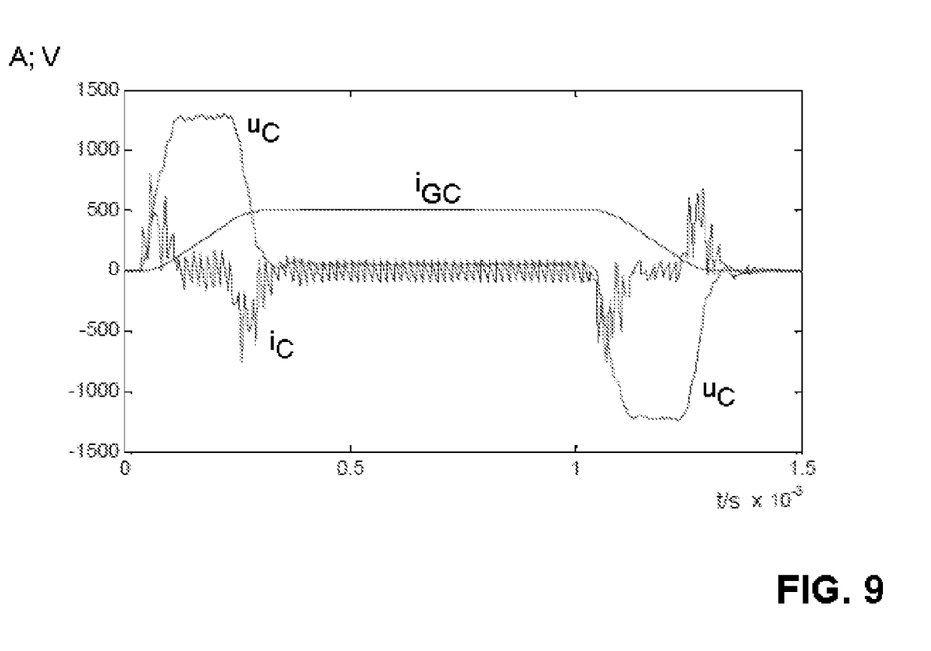
FIG. 9 shows the transient responses of all system states of the controller structure according to FIG. 5.

Finally, the transient response of all system states including the gradient coil current $i_{GC}$ and the states $u_C$ and $i_C$ of the output filter F are depicted in FIG. 9 for a ramp current of 500 A. In this examples, the voltage $u_C$ at the capacitor $C_f$ (see FIG. 4) is equivalent to the low-pass filtered PWM voltage. The maximum voltage $u_C$ is about ±1300V and is needed to drive the gradient coil current $i_{GC}$ from 0 to about 500 A in about 0.2 ms. Due to the nearly perfect controller damping of the LC filter F at the output of the inverter unit Inv, no oscillations with the resonance frequency can be observed.

While the invention has been illustrated and described in detail in the drawings and foregoing description, such illustration and description is to be considered illustrative or exemplary and not restrictive, and the invention is not limited to the disclosed embodiments. Variations to the embodiments of the invention described in the foregoing, e.g. with respect to the antenna elements themselves, their shapes and numbers and arrangements in relation to each other, in order to obtain the above explained result of at least substantially identical fields of view for nuclei having substantially different gyromagnetic ratios are possible for a person skilled in the art without departing from the basic principle of the invention as defined by the accompanying claims.

Variations to the disclosed embodiments can be understood and effected by those persons skilled in the art in practicing the claimed invention, from a study of the drawings, the disclosure, and the appended claims. In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage. Any reference signs in the claims should not be construed as limiting the scope of the claims.

The invention claimed is:

1. A method for operating an MRI gradient magnet system for generating gradient magnetic fields, by driving gradient coil currents through gradient coils of the gradient magnet system, wherein the gradient coil currents are controlled by a controller which is realized in the form of a state space feedback controller in the digital domain and which generates a digital output value by means of which a pulse-width modulated voltage is generated for driving the gradient coil currents through the gradient coils with a predetermined waveform wherein a control deviation is integrated which is generated in the form of a difference between the gradient coil current and a reference current, the digital output value (u) is generated from the integrated control deviation, for delay compensation, and the digital output value (u) is fed back and delayed by one clock cycle, two clock cycles, and three clock cycles and then subtracted from the digital output value (u).

2. A digital amplifier system for operating an MRI gradient magnet system for generating gradient magnetic fields, by driving gradient coil currents through gradient coils (GC) of the gradient magnet system, wherein the amplifier system comprises a digital controller (Con) for controlling the gradient coil currents, which controller (Con) is realized in the form of a state space feedback controller in the digital domain for generating a digital output value (u) by means of which a pulse-width modulated voltage is generated for driving the gradient coil currents through the gradient coils with a predetermined waveform, wherein the controller (Con) comprises an integration part (GI) for integrating a control deviation which is generated in the form of a difference between the gradient coil current and a reference current, wherein the controller (Con) comprises a delay compensator ($G_{STAB}$) for generating the digital output value (u) from the integrated control deviation, and wherein the delay compensator ($G_{STAB}$) comprises a feedback loop by means of which the digital output value (u) is fed back and delayed by one, two and three clock cycles and then subtracted from the digital output value (u).

3. The digital amplifier system according to claim 2, wherein the delay compensator ($G_{STAB}$) comprises a feedback loop by means of which the digital output value (u) is fed back via a transfer function ($G_{UC}$, $G_{IC}$) of a gradient coil output filter (F) for a gradient coil voltage ($u_C$) and an output current ($i_C$) and then subtracted from the digital output value (u).

4. The digital amplifier system according to claim 2, wherein the controller (Con) comprises a transfer function (GGC) in series to a delay chain for the measurement value of the gradient coil current ($i_{GC}$) of an A/D converter (A/D), by means of both of which the gradient coil current is generated from the digital output value (u).

5. A digital amplifier system for a magnetic resonance gradient magnet system which includes gradient coils configured to generate gradient magnetic fields in response to driving gradient coil currents, the amplifier system comprising:

a digital controller configured to control the gradient coil currents, the digital controller including a state space feedback controller in a digital domain configured to generate a digital output value for generating a pulse-width modulated voltage for driving the gradient coil currents through the gradient coils with a predetermined waveform;

the digital controller further including an integration circuit configured to integrate a control deviation, the control deviation being generated from a difference between the gradient coil current and a reference current;

the digital controller further including a delay compensation circuit configured to generate the digital output value from the integrated control deviation; and the delay compensator includes a feedback loop configured to delay the digital output value by one, two, and three clock cycles and subtract the digital output signal delayed by one, two, and three clock cycles from the current digital output value.

* * * * *